US008637343B2

(12) United States Patent
Mueller et al.

(10) Patent No.: US 8,637,343 B2
(45) Date of Patent: Jan. 28, 2014

(54) PROCESS FOR PREPARING AN ELECTRONIC DEVICE

(75) Inventors: David Christoph Mueller, Winchester (GB); Toby Cull, Southampton (GB); Simon Dominic Ogier, Bedale (GB)

(73) Assignee: Merck Patent GmbH, Darmstadt (DE)

( * ) Notice: Subject to any disclaimer, the term of this patent is extended or adjusted under 35 U.S.C. 154(b) by 540 days.

(21) Appl. No.: 12/597,246

(22) PCT Filed: Mar. 28, 2008

(86) PCT No.: PCT/EP2008/002484
§ 371 (c)(1),
(2), (4) Date: Oct. 23, 2009

(87) PCT Pub. No.: WO2008/131836
PCT Pub. Date: Nov. 6, 2008

(65) Prior Publication Data
US 2010/0108999 A1 May 6, 2010

(30) Foreign Application Priority Data

Apr. 25, 2007 (EP) .................................. 07008369

(51) Int. Cl.
*H01L 51/40* (2006.01)
(52) U.S. Cl.
USPC ........ 438/99; 438/158; 257/40; 257/E29.291; 257/E51.005
(58) Field of Classification Search
USPC ......... 257/40, E29.291, E51.005; 438/82, 99, 438/158
See application file for complete search history.

(56) References Cited

U.S. PATENT DOCUMENTS

| 6,300,988 | B1 * | 10/2001 | Ishihara et al. ................. 349/43 |
| 6,913,944 | B2 | 7/2005 | Hirai |
| 7,015,503 | B2 * | 3/2006 | Seki et al. ........................ 257/40 |
| 7,029,945 | B2 * | 4/2006 | Veres et al. ..................... 438/99 |
| 7,364,940 | B2 | 4/2008 | Kim et al. |
| 7,425,730 | B2 * | 9/2008 | Lee et al. ........................ 257/98 |
| 7,495,252 | B2 | 2/2009 | Ahn et al. |
| 7,557,369 | B2 * | 7/2009 | Humbs et al. .................. 257/40 |
| 7,560,735 | B2 * | 7/2009 | Furukawa et al. .............. 257/72 |
| 7,754,523 | B2 | 7/2010 | Seo et al. |
| 7,851,788 | B2 | 12/2010 | Ohta |
| 7,919,396 | B2 | 4/2011 | Ahn et al. |
| 2004/0012018 | A1 * | 1/2004 | Tanabe ........................... 257/40 |
| 2004/0129937 | A1 | 7/2004 | Hirai |
| 2005/0156163 | A1 | 7/2005 | Hirai |
| 2005/0194640 | A1 * | 9/2005 | Lazarev ........................ 257/347 |
| 2005/0211975 | A1 | 9/2005 | Kawasaki et al. |
| 2005/0285102 | A1 * | 12/2005 | Koo et al. ........................ 257/40 |

(Continued)

FOREIGN PATENT DOCUMENTS

CN 1743930 3/2006
CN 1874023 12/2006

(Continued)

OTHER PUBLICATIONS

International Search Report of PCT/EP2008/002484 (Jul. 3, 2008).

*Primary Examiner* — David Vu
(74) *Attorney, Agent, or Firm* — Millen, White, Zelano & Branigan, P.C.

(57) ABSTRACT

The invention relates to a process for preparing an electronic device using a protection layer, and to improved electronic devices prepared by this process, in particular organic field effect transistors (OFETs).

23 Claims, 11 Drawing Sheets

(56) References Cited

U.S. PATENT DOCUMENTS

| | | |
|---|---|---|
| 2006/0046339 A1 | 3/2006 | Seo et al. |
| 2006/0118793 A1* | 6/2006 | Yang et al. ............... 257/79 |
| 2006/0151781 A1 | 7/2006 | Kim et al. |
| 2006/0267094 A1 | 11/2006 | Ahn et al. |
| 2006/0281256 A1 | 12/2006 | Carter et al. |
| 2007/0158651 A1 | 7/2007 | Song et al. |
| 2007/0221918 A1 | 9/2007 | Hirai |
| 2008/0230774 A1 | 9/2008 | Hirai |
| 2009/0166611 A1 | 7/2009 | Ohta |
| 2009/0170291 A1 | 7/2009 | Ahn et al. |
| 2010/0090220 A1 | 4/2010 | Kawasaki et al. |

FOREIGN PATENT DOCUMENTS

| | | |
|---|---|---|
| EP | 1 434 282 | 6/2004 |
| EP | 1 679 754 | 7/2006 |
| EP | 1 727 206 A1 | 11/2006 |
| GB | 2 428 889 A | 2/2007 |
| JP | 8 236775 | 9/1996 |
| JP | 2003 303970 | 10/2003 |
| JP | 2005 277238 | 10/2005 |
| JP | 2006 147811 | 6/2006 |
| JP | 2007 103931 | 4/2007 |
| JP | 2007 53147 | 9/2008 |
| KR | 2009 0116593 | 11/2009 |
| WO | WO-2007 099690 | 9/2007 |

* cited by examiner

PROCESS FOR PREPARING AN ELECTRONIC DEVICE

FIELD OF INVENTION

The invention relates to a process for preparing an electronic device using a protection layer, and to improved electronic devices prepared by this process, in particular organic field effect transistors (OFETs).

BACKGROUND AND PRIOR ART

Organic field effect transistors (OFETs) are used in display devices and logic capable circuits. A conventional OFET typically comprises source, drain and gate electrodes, an semiconducting layer comprising an organic semiconductor (OSC) material, and a gate insulator layer comprising a dielectric material.

For the preparation of a bottom gate device, usually the source and/or drain electrode layer comprising a metal or metal oxide is deposited onto a dielectric layer provided on a substrate. This is typically done by a sputtering process and subsequent lithographic etching process to remove unwanted areas.

Another conventional method of preparing a bottom gate OFET comprises the application of a patterned bank structure onto the dielectric and source/drain electrode layer, followed by deposition of an OSC layer, usually by inkjet printing, onto the bank structure, the dielectric and electrode layer. For the purpose of OSC layer positioning the surface of the bank structure is often subjected to a plasma treatment process before the OSC layer is applied, for example by exposure to a $CF_4$ plasma or $O_2$ plasma. CF4-plasma leads to a Teflon like, extreme hydrophobic surface (very low surface energy), which directs the inkjet drops not deposited accurately enough into the bank structure cavity.

However, it was observed that in the above-mentioned OFET preparation methods the electrode sputtering process and the plasma treatment process can cause significant damage on the exposed parts of the surface of the dielectric layer. As a result, the performance of device subjected to such a process is deteriorating.

It is therefore an aim of the present invention to provide an improved process for preparing electronic devices, in particular OFETs, which does not have the drawbacks of prior art methods and allows time-, cost- and material-effective production of electronic devices on large scale, especially with improved protection of the dielectric layer and other functional layers against plasma surface treatment techniques or plasma assisted deposition techniques that are applied during the device manufacturing process. Another aim of the invention is to provide improved electronic devices, especially OFETs, obtained by such a process. Other aims of the present invention are immediately evident to the expert from the following detailed description.

It was found that these aims can be achieved by providing methods, materials and devices as claimed in the present invention.

SUMMARY OF THE INVENTION

The invention relates to a process for preparing an electronic device comprising a dielectric layer and at least one further functional layer, comprising the step of applying one or more additional layers or components on top of said dielectric layer or functional layer, wherein a protection layer is applied on top of said dielectric layer or on top of said functional layer before applying the additional layers or components. The protection layer has the purpose to reduce or prevent damage in the dielectric layer or in the further functional layer that may be caused by subsequent manufacturing or processing steps of the device, in particular by subsequent steps of applying or processing one or more additional layers or components.

The invention further relates to a process for preparing an electronic device, wherein at least one additional functional layer is applied onto the protection layer, and optionally the protection layer is partially removed after applying or processing at least one of said additional layers.

The invention further relates to a process for preparing an electronic device, comprising the steps of applying a protection layer (4) on top of a dielectric layer (3) or on top of an organic semiconductor (OSC) layer (7), optionally subjecting said protection layer to plasma treatment and/or applying a further layer on at least some parts of the protection layer (4), optionally patterning said further layer, and optionally removing those parts of the protection layer (4) that have been exposed to the plasma, or are not covered by the further layer after patterning. Preferably said further layer is a conductor, very preferably an electrode.

The invention further relates to a process for preparing an electronic device as described above and below, wherein those parts of the protection layer (4) that are not covered by the conductor or electrode layer provided onto it are removed.

The invention further relates to an electronic device obtained by a process as described above and below.

Preferably the electronic device is an organic field effect transistor (OFET), integrated circuit (IC), thin film transistor (TFT), Radio Frequency Identification (RFID) tag, organic photovoltaic (OPV) device, sensor or memory device.

BRIEF DESCRIPTION OF THE DRAWINGS

FIG. 1a depicts an OFET according to prior art.

DETAILED DESCRIPTION OF THE INVENTION

Figure 1B:
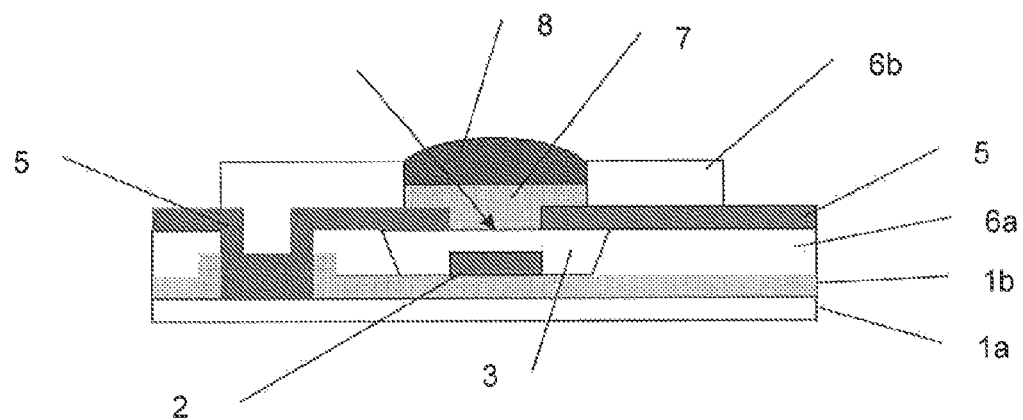
FIG. 1b depicts an OFET obtained by a process according to the present invention.
Figure 1B:
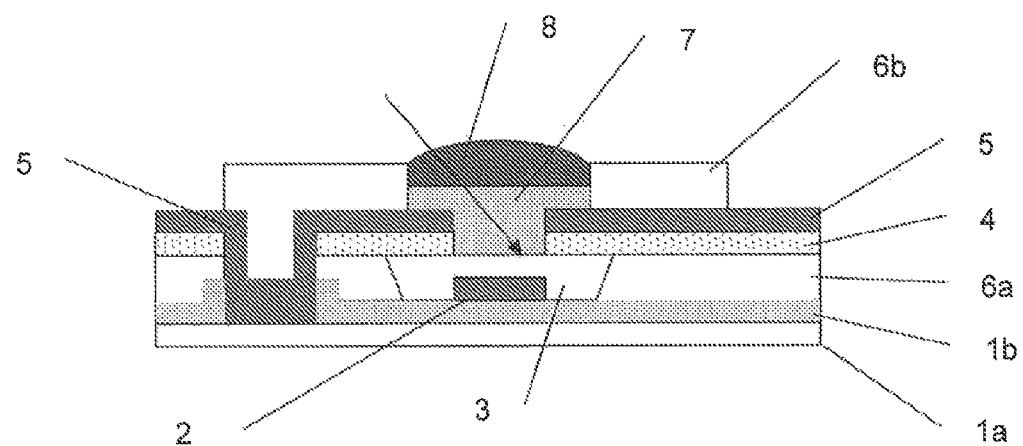

In the process of preparing an electronic device according to the present invention, a thin sacrificial or protective layer (hereinafter referred to as "protection layer") is deposited on top of an (optionally crosslinked) dielectric. The protection layer protects the surface of the dielectric from damage that may be caused by subsequent processing or manufacturing steps during device preparation, like electrode deposition or plasma treatment.

FIG. 1a shows a conventional OFET according to prior art, comprising a substrate (1a), a functional layer (e.g. for planarisation or blacking-out) (1b), a gate electrode (2), a dielectric layer (3), source and drain electrodes (5), first and second bank structures (6a, 6b), an OSC layer (7), and an inkjet passivation layer (8).

During manufacture of the device, typically the electrodes (5) are applied onto the dielectric (3) by a sputtering process, and patterned by etching and/or lithographic patterning. The bank structures (6a, b) are applied and patterned by a lithographic process. The OSC layer (7) and the passivation layer (8) are usually applied by inkjet deposition. Before inkjetting the OSC layer (7), the bank structures (6b) are typically subjected to plasma treatment (e.g. with $O_2$ or Ar or $CF_4$ plasma) to improve their surface for the inkjet process. It was observed that, as a result of the above-mentioned electrode deposition/patterning and plasma treatment processes, the crucial interface between the dielectric (3) and the OSC (7) is often severely damaged. As a result the performance of the device is deteriorating.

It has now been found that these damages can be reduced or even completely prevented, and the device performance can be significantly improved, if the dielectric is covered with a protection layer before deposition of the electrodes and treatment of the bank structures.

This is illustrated in FIG. 1b, showing a device obtained by a process according to the present invention, which comprises the components of FIG. 1a, and additionally comprises a protection layer (4). The protection layer (4) has been applied such that it completely covers the dielectric layer (3), before depositing the source and drain electrodes (5), and before plasma treatment of the bank structure (6b). As a result, those parts of the protection layer (4) that were not covered by the electrodes and were exposed to the plasma (not shown in FIG. 1b), are damaged by the plasma or electrode sputtering process, thus preventing the dielectric (3) from this damage and thereby acting as "sacrifical layer" for the dielectric. Therefore, these parts of the protection layer are preferably removed after plasma treatment, and before ink deposition of the OSC layer (7), so that the original dielectric/OSC interface (3)/(7) (denoted by the arrow) is restored.

The process of preparing an electronic device according to the present invention is suitable for protecting the dielectric against damage caused by plasma assisted processes, i.e. exposure to a plasma of high energy particles or beams, e.g. treatment with a plasma of $O_2$, Ar or $CF_4$ or mixtures thereof. The process is also suitable for protecting the dielectric against damage caused by deposition processes, for example when applying or patterning the electrodes, including but not limited to sputtering processes, vapour or vacuum deposition processes, and subsequent lithographic etching.

A preferred electronic device comprises the following components:
  optionally a substrate (1),
  one or more conductors, preferably electrodes (2, 5),
  an OSC (7),
  an insulator comprising a dielectric (3),
  a protection layer (4) between the insulator and the conductor and/or between the OSC and the conductor.

A preferred embodiment of the invention relates to a process for preparing a bottom gate (BG), bottom contact (BC) electronic device comprising the following components in the sequence described below:
  optionally a substrate (1),
  a gate electrode (2),
  an insulator layer comprising a dielectric (3),
  source and drain electrodes (5),
  an OSC layer (7),
  a protection layer (4) between the insulator layer and the source and drain electrodes.

Figure 2A:
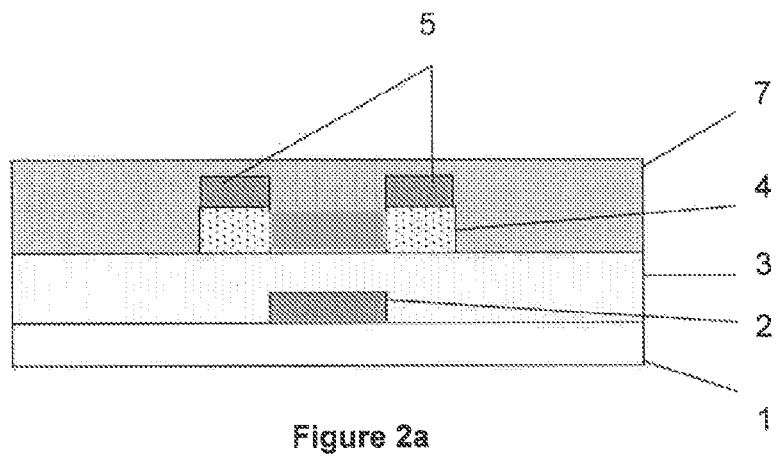
FIGS. 2a and 2b exemplarily show bottom gate OFETs obtained by a process according to the present invention.

FIG. 2a exemplarily depicts a simplified BG/BC OFET according to this embodiment. Therein, (1) is a substrate, (2) is the gate electrode, (3) is a dielectric layer, (4) is a protection layer, (5) are the source and drain electrodes, and (7) is the OSC layer.

The process for preparing this device comprises the steps of applying a gate electrode (2) on a substrate (1), applying a dielectric layer (3) on top of the gate electrode (2) and the substrate (1), applying a protection layer (4) on top of the dielectric layer (3), applying source and drain electrodes (5) on top of the protection layer (4), optionally removing those parts of the protection layer that are not covered by the source and drain electrodes (5), and applying an OSC layer (7) on top of the electrodes (5) and the dielectric layer (3).

Another preferred embodiment relates to a process for preparing a BG, top contact (TC) electronic device comprising the following components in the sequence described below:
  optionally a substrate (1),
  a gate electrode (2),
  an insulator layer comprising a dielectric (3),
  an OSC layer (7),
  source and drain electrodes (5),
  a protection layer (4) between the OSC layer and the source and drain electrodes.

Figure 2B:
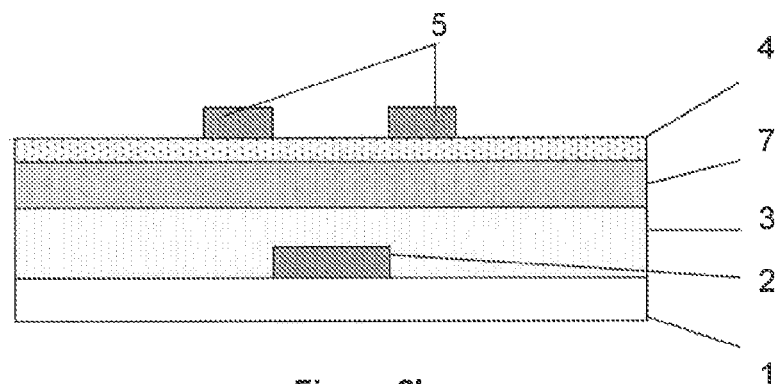

FIG. 2b exemplarily depicts a simplified BG/TC OFET according to this embodiment. Therein, (1) is a substrate, (2) is the gate electrode, (3) is a dielectric layer, (4) is a protection layer, (5) are the source and drain electrodes, and (7) is the OSC layer.

The process for preparing this device comprises the steps of applying a gate electrode (2) on a substrate (1), applying a dielectric layer (3) on top of the gate electrode (2) and the substrate (1), applying an OSC layer (7) on top of the dielectric layer (3), applying a protection layer (4) on top of the OSC layer (7), applying source and drain electrodes (5) on top of the protection layer (4), and optionally removing those parts of the protection layer that are not covered by the source and drain electrodes (5).

Another preferred embodiment relates to a process for preparing a top gate (TG), bottom contact electronic device comprising the following components in the sequence described below:
  a substrate (1),
  source and drain electrodes (5),
  an OSC layer (7),
  an insulator layer comprising a dielectric (3),
  a gate electrode (2),
  a protection layer (4) between the insulator layer and the gate electrode.

Figure 3A:
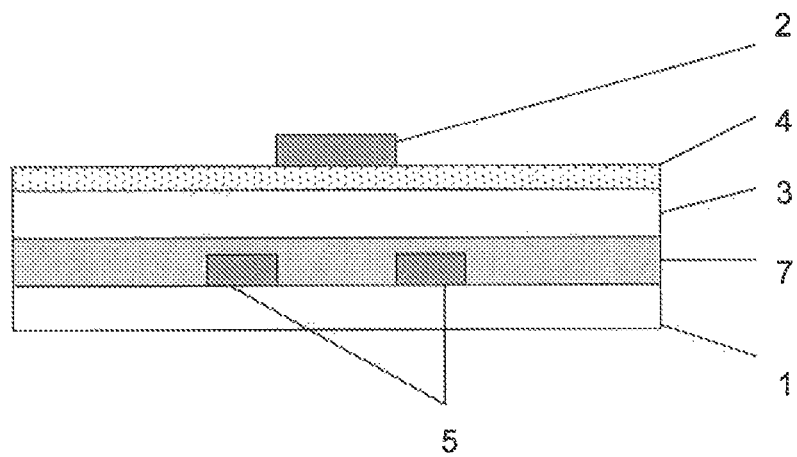
FIGS. 3a and 3b exemplarily show top gate OFETs obtained by a process according to the present invention.

FIG. 3a exemplarily depicts a simplified TG/BC OFET according to this embodiment. Therein, (1) is a substrate, (5) are source and drain electrodes, (7) is an OSC layer, (3) is a dielectric layer, (2) is a gate electrode, and (4) is a protection layer.

The process for preparing this device comprises the steps of applying source and drain electrodes (5) on a substrate (1), applying an OSC layer layer (7) on top of the electrodes (5) and the substrate (1), applying a dielectric layer (3) on top of the OSC layer (7), applying a protection layer (4) on top of the dielectric layer (3), applying a gate electrode (2) on top of the protection layer (4), and optionally removing those parts of the protection layer that are not covered by the gate electrode (2).

Another preferred embodiment relates to a process for preparing a TG, top contact electronic device comprising the following components in the sequence described below:

a substrate (1),
an OSC layer (7),
source and drain electrodes (5),
an insulator layer comprising a dielectric (3),
a gate electrode (2),
a protection layer (4a) between the OSC layer and the source and drain electrodes and/or a protection layer (4b) between the insulator layer and the gate electrode.

Figure 3B:
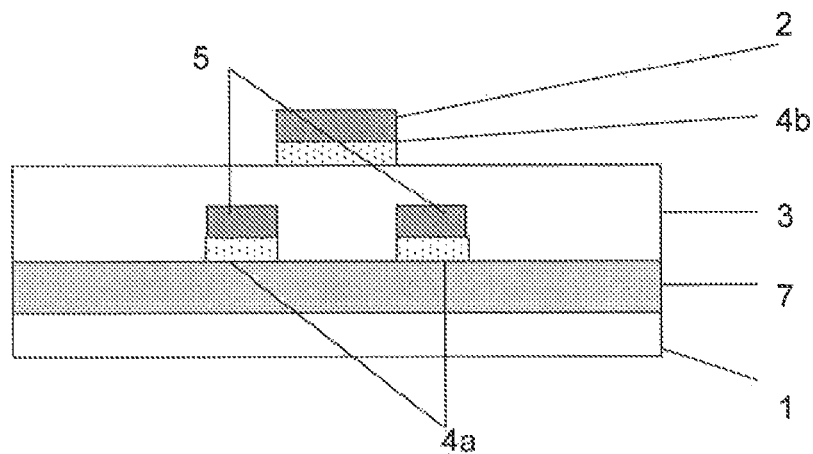

FIG. 3b exemplarily depicts a simplified TG/TC OFET according to this embodiment. Therein, (1) is a substrate, (5) are source and drain electrodes, (7) is an OSC layer, (3) is a dielectric layer, (2) is a gate electrode, and (4a) and (4b) are protection layers.

The process for preparing this device comprises the steps of applying an OSC layer (7) on a substrate (1), optionally applying a protection layer (4a) on top of the OSC layer (7), applying source and drain electrodes (5) on top of the OSC layer (7) or the protection layer (4a), optionally removing those parts of the protection layer (4a) that are not covered by the source and drain electrodes (5), applying a dielectric layer (3) on top of the source and drain electrodes (5), optionally applying a protection layer (4b) on top of the dielectric layer (3), applying a gate electrode (2) on top of the dielectric layer (3) or the protection layer (4b), and optionally removing those parts of the protection layer (4b) that are not covered by the gate electrode (2).

Figure 4:
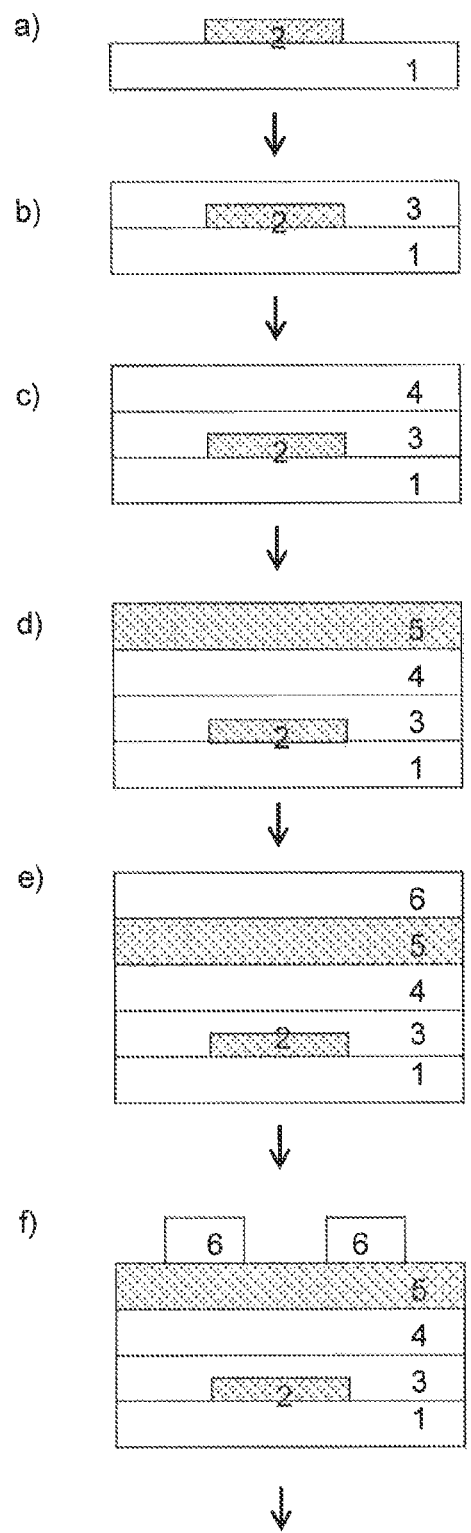
FIGS. 4 and 5 exemplarily illustrate preferred processes for preparing an OFET according to the present invention.
Figure 4:
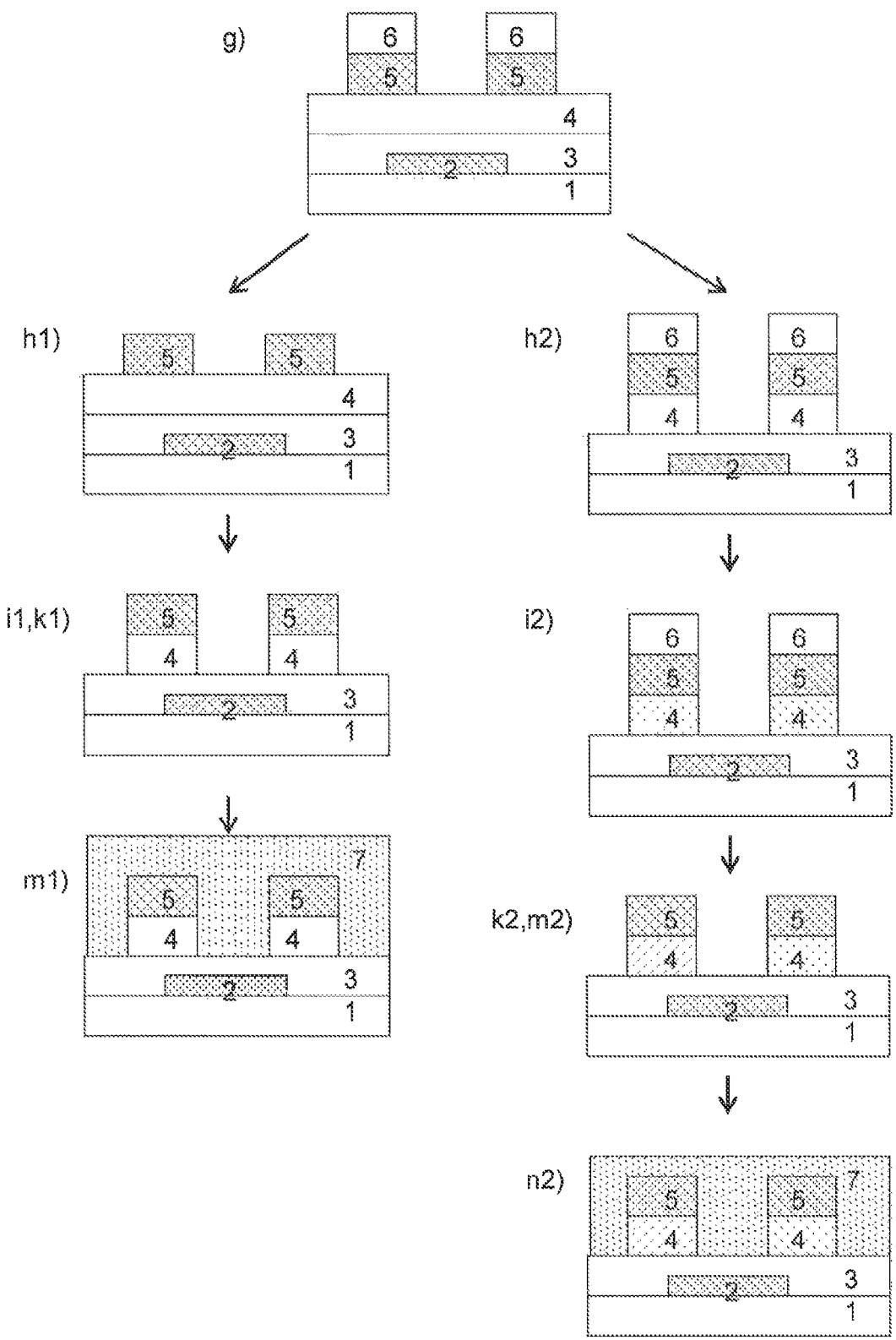

FIG. 4 exemplarily illustrates a process for preparing a BG/BC electronic device according to another preferred embodiment of the present invention. Such a preferred process comprises the following steps:
a) providing one or more first electrodes (2) on a substrate (1),
b) providing a layer of a dielectric (3) on the substrate (1) and the first electrodes (2),
c) providing a protection layer (4) on top of the dielectric layer (3),
d) providing one or more second electrodes (5) on top of the protection layer (4),
e) providing a photoresist layer (6) on top of the second electrodes (5),
f) treating the photoresist (6) by a suitable method to leave a pattern of areas with and without photoresist (6) on top of the second electrodes (5),
g) removing those parts of the second electrodes (5) that are not covered by the photoresist (6),
h1) removing the photoresist (6),
i1) removing those parts of the protection layer (4) that are not covered by the second electrodes (5),
k1) optionally treating the remaining parts of the protection layer (4), for example by washing, to remove residues caused by step f), like ions, doping sites or the like, and
m1) applying an OSC layer (7) onto the uncovered parts of the dielectric layer (3) and the second electrodes (5),
or, alternatively to steps h1)-m1),
h2) removing those parts of the protection layer (4) that are not covered by the second electrodes (5),
i2) optionally curing the remaining parts of the protection layer (4),
k2) removing the photoresist (6),
m2) optionally treating the remaining parts of the protection layer (4), for example by washing, to remove residues caused by step f), like ions, doping sites or the like, and
n2) applying an OSC layer (7) onto the uncovered parts of the dielectric layer (3) and the second electrodes (5).

Figure 5:
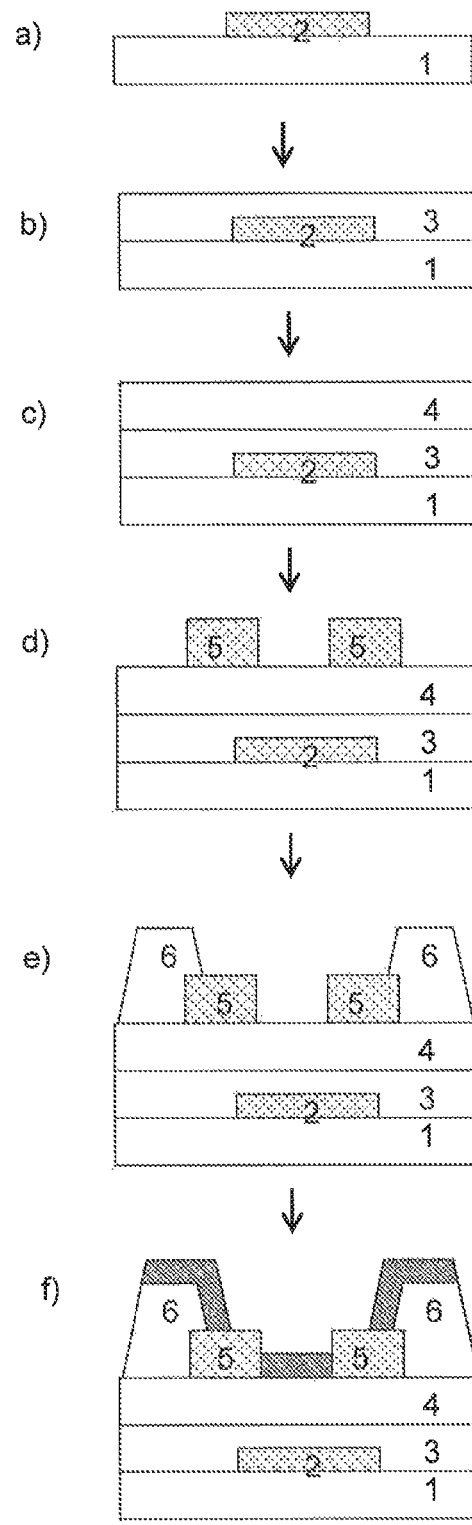
Figure 5:
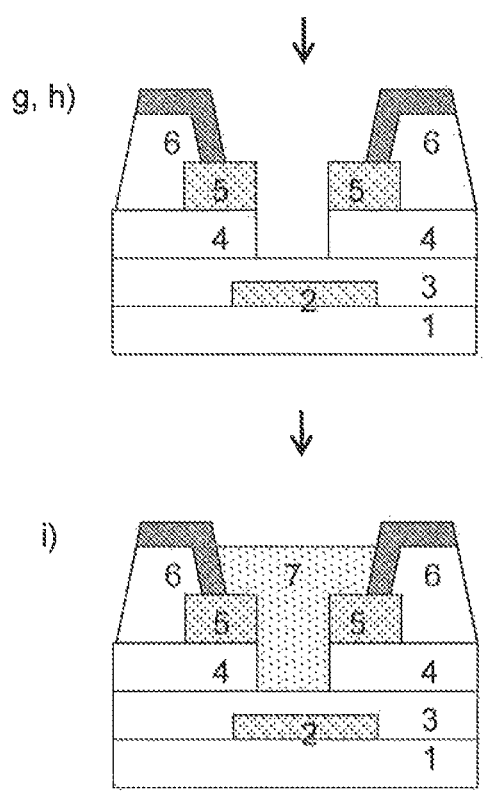

FIG. 5 exemplarily illustrates a process for preparing a BG/BC gate electronic device according to another preferred embodiment of the present invention. Such a preferred process comprises the following steps:

a) providing one or more first electrodes (2) on a substrate (1)
b) forming a layer of a dielectric (3) on the substrate (1) and the first electrodes (2),
c) providing a protection layer (4) on top of the dielectric layer (3),
d) providing one or more second electrodes (5) on top of the protection layer (4),
e) providing a bank structure layer (6) on top of the protection layer (4) and the second electrodes (5), so that it does at least partially cover the protection layer (4) and the second electrodes (5),
f) subjecting the bank structure layer (6), and those parts of the protection layer (4) that are not covered by the second electrodes (5) or the bank structure layer (6), to plasma treatment,
g) removing those parts of the protection layer (4) that are not covered by the second electrodes (5) or the bank structure layer (6),
h) optionally treating the remaining parts of the protection layer (4), for example by washing, to remove residues caused by step f), like ions, doping sites or the like, and
i) applying an OSC layer (7) onto the uncovered parts of the dielectric layer (3) and the second electrodes (5).

In the processes described above and shown in FIGS. 4 and 5 the first electrode (2) is preferably a gate electrode and the second electrodes (5) are preferably source/drain electrodes. Top gate and/or top contact devices can be prepared in analogy to the processes described above and in FIGS. 4 and 5.

Once being applied, the protection layer, in at least some parts of the device, will preferably remain in the final device, i.e. it will not be removed during further manufacturing or processing steps. For example, the protection layer will usually remain on those parts of the dielectric or OSC layer that are covered by the electrodes. For this purpose, the protection layer should preferably be stabilised in those parts, for example by curing or other suitable methods of modifying its solublity, so that it cannot be removed (together with the electrodes). On the other hand, the protection layer should preferably remain soluble in those parts that are not covered by the electrodes, so that it can be removed at least partially in a subsequent step.

This can be achieved by chemically altering the protection layer material during or after the sputter/etching process steps that are carried out to apply or pattern the electrode.

In addition, the protection layer should exhibit sufficient adhesion for the electrodes that are applied onto it. This can be achieved by appropriate selection of the protection layer material and the thickness of the protection layer.

In another preferred embodiment the protection layer is altered during the exposure to the plasma so that its solubility is changed, e.g. getting more hydrophilic, so that it can be developed in an orthogonal, polar solvent. In this case, the non attacked part of the protective layer will remain in the device and only the damaged part will be removed.

After plasma treatment or electrode application, the protection layer can be removed from those parts of the dielectric or OSC layer that are not covered by the electrodes. This can be achieved by standard methods, like e.g. wet chemical removal. After (partial) wet chemical removal of the protection layer the initial properties of the dielectric layer are recovered.

The protection layer should be selected to be thick enough to protect the initial dielectric surface, e.g. from the impact of the highly reactive species formed in the plasma assisted process. Preferably the thickness of the protection layer is from 1 to 500 nm, very preferably from 1 to 100 nm.

In another preferred embodiment the protection layer is thin enough that the electrodes deposited through a mask are "stabilising" (as a result of the penetrating sputtered ions) the protection layer underneath (so that no lift-off occurs), and the initial dielectric/OSC layer surface can be recovered by development of the unexposed protection layer in a suitable solvent ("self patterning concept"). The thickness of the protection layer according to this preferred embodiment is preferably from 1 to 500 nm, very preferably from 1 to 100 nm.

The protection layer material is preferably an organic material, but can also be an inorganic material, like e.g. vacuum deposited oxides, solution processable nanoparticles, which can be conducting or non-conducting, or hybrids thereof. Preferably it is selected from materials that are solution processable or can be deposited by vacuum deposition techniques, e.g. parylenes such as para-xylylene (as disclosed in U.S. Pat. No. 3,342,754), very preferably from solution processable organic polymers.

A wide range of materials is suitable for use in the protection layer. Besides good adhesion to the electrodes as mentioned above, the protection layer material should preferably exhibit one or more of the following properties:

- a good adhesion on standard dielectrics used for preparing electronic devices,
- a high structural integrity, for example by using a polymeric or amorphous material with a high glass temperature or a crosslinked material, or by using a material comprising one or more functional groups that can be crosslinked in a subsequent processing or developing step (i.e. after application on the dielectric/OSC layer), e.g. by thermal curing or photocuring,
- a good dry etch resistance, for example by using Si-containing or fluorinated polymers, polymers with aliphatic cage structures (like adamantyl etc), polyimides or the like,
- a low dielectric permittivity, preferably being in the range of the permittivity of the dielectric layer,
- a high UV absorption, e.g. via mixed-in, high UV absorbing, molecules,
- a material comprising antioxidant properties, groups or components,
- a material comprising conducting or semiconducting properties, groups or components,
- a low gas permeability,
- a high resistance against photoresist stripping.

This can be achieved by using either a single material or a combination (mixture) of materials, which allows the selective adoption to the specific process.

If the protection layer is applied between the OSC layer and the electrode(s) (for example in a BG/TC device as shown in FIG. 2b), the protection layer material itself or the chosen thickness should not be too insulating, so that the device performance is not too negatively affected.

In another preferred embodiment the protection layer material has a high etch resistance against a plasma based process. The protection layer inter alia has the function of protecting the layer underneath against the impact of high energy particles or beams. This protective function can be enhanced by increasing the protection layer thickness, or by using a protection layer material with increased stability against such high energy particles or beams. If a material with high stability is used, the thickness can be reduced, which is advantageous for the device geometry.

Further preferred is a protection layer material having a high UV absorption, or comprising one or more functional groups or components having high UV absorption, especially in the wavelength range below 300 nm.

The protection layer material should be selected so that it does not have a negative influence, or only to a small extent, on the transistor performance, in particular in those parts of the protection layer that will be covered by the electrodes and will remain in the final device, especially those parts that are located close to the transistor channel. For example, if the protection layer comprises an insulating material and has a high thickness, it can hinder the injection of charge carriers into the OSC layer. On the other hand, a protection layer comprising a material with a high dielectric permittivity may reduce the charge carrier mobility. In addition, reactive products created by the plasma treatment process can be transferred from the protection layer to the OSC layer. In some cases the reactive products, like ions, doping sites etc., can be removed by a selective treatment (e.g. washing) step.

Suitable and preferred protection layer materials include, without limitation, perfluorinated or partially fluorinated organic polymers, polyimides like for example those from the commercially available HIMAL® series (Hitachi), polycycloolefins like for example those from the commercially available Avatrel® series (Promerus LLC), Topas® series (Ticona) or Zeonor® series (Zeon Chemicals), dielectric polymers with additional functionality, for example polycycloolefins with alkoxysilane or vinyl alkoxysilane groups, like those of the commercially available Alkoxysilane Aprima® series (Promerus LLC), UV absorbing polymers like polyacenapthylene or co-polymers thereof, or curable precursors of the aforementioned polymers.

Especially preferably the protection layer material is selected from highly soluble fluoropolymers, for example from the commercially available Cytop® series (Asahi Glass), like the perfluoro(1-butenyl vinyl ether) homocyclopolymer of formula 1[poly(1,1,2,4,4,5,5,6,7,7-decafluoro-3-oxa-1,6-heptadiene],

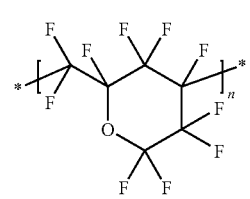

or from the commercially available TeflonAF® series (DuPont), like the poly[4,5-difluoro-2,2-bis(trifluoromethyl)-1,3-dioxole-co-tetrafluoroethylene of formula 2,

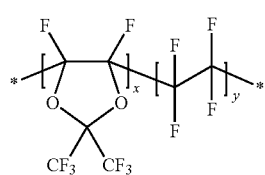

furthermore polyacenaphthylene of formula 3,

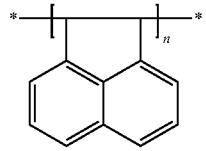

poly-N-vinylcarbazole of formula 4,

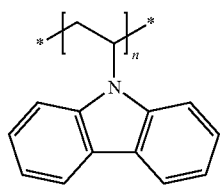

poly(2-vinylnaphthalene of formula 5,

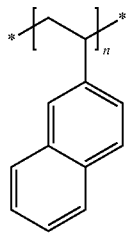

poly(4-vinylbiphenyl) of formula 6,

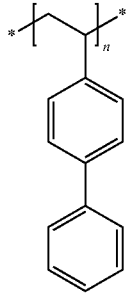

or poly(1-vinylnaphthalene) of formula 7,

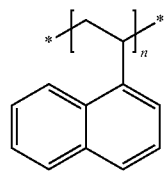

wherein n is an integer >1, 0<x<1 and 0<y<1, or copolymers comprising one or more units of the above-mentioned formulae 1-7. Polymers of formula 3-7 are commercially available from Aldrich.

In case the device is subjected to $CF_4$ plasma treatment, the risk of damage due to UV absorption will be higher compared to an $O_2$ plasma process. Many materials tend to crosslink under those conditions. For this case, a silicon containing protection layer material is especially preferred, like for example curable polysilsesquioxanes, e.g. those of the Hard-Sil™ series (commercially available from Gelest Inc., Morrisville Pa., USA) or the materials of the AS Hardcoat™ or SHC™ series (from Momentive Performance Materials Inc., Wilton, Conn., USA) such as AS4000 Hardcoat™, AS4700 Hardcoat™ or SHC™ 5020, or thermosetting polysiloxane resins, e.g. those commercially available from Techneglas, Perrysburg Ohio, USA.

In another preferred embodiment of the present invention, the protection layer comprises, preferably consists of, the same material as the dielectric layer. This has the advantage that the adhesion of the protective layer is improved and stress during the process (e.g. caused by different thermal coefficients of th individual layers) is reduced.

In another preferred embodiment the dielectric layer material comprises a compound with one or more reactive groups which can react with, e.g. be grafted on or copolymerize with, the protective layer material in a subsequent reaction step, to achieve covalent bonding between the materials.

The other components or functional layers of the electronic device, like the substrate, the insulator, the conductor or electrodes, and the OSC, can be selected from standard materials, and can be manufactured and applied to the device by standard methods. Suitable materials and manufacturing methods for these components and layers are known to the skilled person and are described in the literature.

The application methods include liquid coating and vapour or vacuum deposition. Preferred deposition techniques include, without limitation, dip coating, spin coating, ink jet printing, letter-press printing, screen printing, doctor blade coating, roller printing, reverse-roller printing, offset lithography printing, flexographic printing, web printing, spray coating, brush coating or pad printing. Ink-jet printing is particularly preferred as it allows high resolution layers and devices to be prepared.

Generally the thickness of a functional layer in an electronic device according to the present invention may be from 1 nm (in case of a monolayer) to 10 μm, preferably from 1 nm to 1 μm, more preferably from 1 nm to 500 nm.

Various substrates may be used for the fabrication of organic electronic devices, for example glass or plastics, plastics materials being preferred, examples including alkyd resins, allyl esters, benzocyclobutenes, butadiene-styrene, cellulose, cellulose acetate, epoxide, epoxy polymers, ethylene-chlorotrifluoro ethylene, ethylene-tetra-fluoroethylene, fibre glass enhanced plastic, fluorocarbon polymers, hexafluoropropylenevinylidene-fluoride copolymer, high density polyethylene, parylene, polyamide, polyimide, polyaramid, polydimethylsiloxane, polyethersulphone, polyethylene, polyethylenenaphthalate, polyethyleneterephthalate, polyketone, polymethylmethacrylate, polypropylene, polystyrene, polysulphone, polytetrafluoroethylene, polyurethanes, polyvinylchloride, silicone rubbers, silicones. Preferred substrate materials are polyethyleneterephthalate, polyimide, and polyethylenenaphthalate. The substrate may be any plastic material, metal or glass coated with the above materials. The substrate should preferably be homogenous to ensure good pattern definition. The substrate may also be uniformly prealigned by extruding, stretching, rubbing or by photochemical techniques to induce the orientation of the organic semiconductor in order to enhance carrier mobility.

The dielectric material for the insulator layer may be inorganic or organic or a composite of the two. It is preferred that the insulator is solution coated which allows ambient processing, but could be also deposited by various vacuum deposition techniques. When the insulator is being patterned, it may perform the function of interlayer insulation or act as gate insulator for an OFET. Preferred deposition techniques include, without limitation, dip coating, spin coating, ink jet printing, letter-press printing, screen printing, doctor blade coating, roller printing, reverse-roller printing, offset lithography printing, flexographic printing, web printing, spray coating, brush coating or pad printing. Ink-jet printing is particularly preferred as it allows high resolution layers and devices to be prepared. Optionally, the dielectric material could be cross-linked or cured to achieve better resitivity against solvents and/or structural integrity and/or to enable patternability (photolithography) Preferred gate insulators are those that provide a low permittivity interface to the OSC.

Suitable and preferred organic dielectric materials include, without limitation, fluorinated para-xylene , fluoropolyarylether, fluorinated polyimide polystyrene, poly(a-methylstyrene), poly(a-vinylnaphtalene), poly(vinyltoluene), polyethylene, cis-polybutadiene, polypropylene, polyisoprene, poly(4-methyl-1-pentene), poly (4-methylstyrene), poly(chorotrifluoroethylene), poly(2-methyl-1,3-butadiene), poly(p-xylylene), poly($\alpha$-$\alpha$-$\alpha$'-$\alpha$'tetrafluoro-p-xylylene), poly[1,1-(2-methyl propane)bis(4-phenyl)carbonate], poly (cyclohexyl methacrylate), poly(chlorostyrene), poly(2,6-dimethyl-1,4-phenylene ether), polyisobutylene, poly(vinyl cyclohexane), poly(vinylcinnamate), poly(4-vinylbiphenyl), poly(1,3-butadiene), polyphenylene. Further preferred are copolymers, including regular, random or block copolymers like poly(ethylene/tetrafluoroethylene), poly(ethylene/chlorotrifluoro-ethylene), fluorinated ethylene/propylene copolymer, polystyrene-co-$\alpha$-methylstyrene, ethylene/ethyl acrylate copolymer, poly(styrene/10% butadiene), poly(styrene/15% butadiene), poly(styrene/2,4 dimethylstyrene). Further preferred are polymers from the commercially availabe Topas® series (Ticona), polycycloolefins like those from the commercially availabe Avatrel® series (Promerus LLC) and highly soluble perfluoropolymers like those from the commercially availabe Cytop® series (Asahi Glass) or TeflonAF® series (DuPont).

For specific devices it may be preferablay to use a dielectric matrial with a high permittivity. Suitable and preferred organic dielectric materials of this type include, without limitation, for example, polvinylalcohol, polyvinylphenol, polymethylmethacrylate, cyanoethylated polysaccharides such as cyanoethylpullulane, high permittivity flurorpolymers such as polyvinylidenefluoride, polyurethane polymers and poly (vinyl chloride/vinylacetate) polymers. Suitable and preferred inorganic dielectric materials of this type include, without limitation, for example composites of $TiO_2$, $Ta_2O_5$, $SrTiO_3$, $Bi_4Ti_3O_{12}$, $BaMgF_4$, barium zirconium titanate or barium strontium titanate.

In a preferred embodiment of the present invention the insulator layer comprises, or consists of, an organic dielectric material having a low permittivity, preferably having a relative permittivity from 1.1 to below 3.0, as disclosed for example in WO 03/052841. Suitable and preferred materials for this embodiment include, without limitation, polypropylene, polyisobutylene, poly(4-methyl-1-pentene), polyisoprene, poly(vinyl cyclohexane), or a copolymer containing the monomer units of at least one of these materials, polycycloolefins like those from the Avatrel® series and fluoropolymers, in particular those from the Cytop® or TeflonAF® series.

In another preferred embodiment of the present invention, the dielectric layer comprises, or consists of, the same material as the protection layer.

The conductor is for example an electrode for an OFET or another electronic device, or an interconnect between the OFET and another element. The conductor may also act as part of a passive circuit element in an OFET circuit, for example a capacitor, conductor or antenna for an RFID-tag. The conductor or electrode can be deposited by liquid coating, such as spray-, dip-, web- or spin-coating, or by vacuum deposition or vapour deposition methods.

Suitable conductor and electrode materials and methods for applying them are known to the skilled person. Suitable electrode materials include, without limitation, inorganic or organic materials, or composites of the two. Examples for suitable conductor or electrode materials include polyaniline, polypyrrole, PEDOT or doped conjugated polymers, further dispersions or pastes of graphite or particles of metal such as Au, Ag, Cu, Al, Ni or their mixtures as well as sputtercoated or evaporated metals, like e.g. Cu, Cr, Pt/Pd etc., and semiconductors like e.g. ITO. Organometallic precursors may also be used deposited from a liquid phase.

The OSC materials and methods for applying the OSC layer can be selected from standard materials and methods known to the skilled person and described in the literature.

In case of OFET devices, where the OFET layer is an OSC, it may be an n- or p- type OSC, which can be deposited by vacuum or vapour deposition, or preferably deposited from a solution. Preferred OSCs have a FET mobility of greater than $10^{-5}$ $cm^2V^{-1}s^{-1}$.

The OSC is used for example as the active channel material in an OFET or a layer element of an organic rectifying diode. OSCs that are deposited by liquid coating to allow ambient processing are preferred. OSCs are preferably spray-, dip-, web- or spin-coated or deposited by any liquid coating technique. Ink-jet deposition is also suitable. The OSC may optionally be vacuum or vapour deposited.

The semiconducting channel may also be a composite of two or more of the same types of semiconductors. Furthermore, a p-type channel material may, for example be mixed with n-type materials for the effect of doping the layer. Multilayer semiconductor layers may also be used. For example the semiconductor may be intrinsic near the insulator interface and a highly doped region can additionally be coated next to the intrinsic layer.

The OSC material may be any conjugated aromatic molecule containing at least three aromatic rings. The OSCs preferably contain 5, 6 or 7 membered aromatic rings, and more preferably contain 5 or 6 membered aromatic rings. The material may be a monomer, oligomer or polymer, including mixtures, dispersions and blends.

Each of the aromatic rings optionally contains one or more hetero atoms selected from Se, Te, P, Si, B, As, N, O or S, preferably from N, O or S.

The aromatic rings may be optionally substituted with alkyl, alkoxy, polyalkoxy, thioalkyl, acyl, aryl or substituted aryl groups, halogen, particularly fluorine, cyano, nitro or an optionally substituted secondary or tertiary alkylamine or arylamine represented by —N($R^3$)($R^4$), where $R^3$ and $R^4$ each independently is H, optionally substituted alkyl, optionally substituted aryl, alkoxy or polyalkoxy groups. Where $R^3$ and $R^4$ is alkyl or aryl these may be optionally fluorinated.

The rings may be optionally fused or may be linked with a conjugated linking group such as —C($T_1$)=C($T_2$)—, —C≡C—, —N(R')—, —N=N—, (R=)=N—, —N=C (R')—. $T_1$ and $T_2$ each independently represent H, Cl, F, —C≡N or lower alkyl groups particularly $C_{1-4}$ alkyl groups; R' represents H, optionally substituted alkyl or optionally substituted aryl. Where R' is alkyl or aryl these may be optionally fluorinated.

Other OSC materials that can be used in this invention include compounds, oligomers and derivatives of compounds of the following: conjugated hydrocarbon polymers such as polyacene, polyphenylene, poly(phenylene vinylene), polyfluorene including oligomers of those conjugated hydrocarbon polymers; condensed aromatic hydrocarbons such as tetracene, chrysene, pentacene, pyrene, perylene, coronene, or substituted derivatives of these; oligomeric para substituted phenylenes such as p-quaterphenyl (p-4P), p-quinquephenyl (p-5P), p-sexiphenyl (p-6P), or soluble substituted derivatives of these; conjugated heterocyclic polymers such as poly(3-substituted thiophene), poly(3,4-bisubstituted thiophene), polybenzothiophene, polyisothianapthene, poly(N-substituted pyrrole), poly(3-substituted pyrrole), poly(3,4-bisubstituted pyrrole), polyfuran, polypyridine, poly-1,3,4-oxadiazoles, polyisothianaphthene, poly(N-substituted aniline), poly(2-substituted aniline), poly(3-substituted aniline), poly(2,3-bisubstituted aniline), polyazulene, polypyrene; pyrazoline compounds; polyselenophene; polybenzofuran; polyindole; polypyridazine; benzidine compounds; stilbene compounds; triazines; substituted metallo- or metal-free porphines, phthalocyanines, fluorophthalocyanines, naphthalocyanines or fluoronaphthalocyanines; $C_{60}$ and $C_{70}$ fullerenes; N,N'-dialkyl, substituted dialkyl, diaryl or substituted diaryl-1,4,5,8-naphthalenetetracarboxylic diimide and fluoro derivatives; N,N'-dialkyl, substituted dialkyl, diaryl or substituted diaryl 3,4,9,10-perylenetetracarboxylicdiimide; bathophenanthroline; diphenoquinones; 1,3,4-oxadiazoles; 11,11,12,12-tetracyanonaptho-2,6-quinodimethane; α,α'-bis(dithieno[3,2-b2',3'-d]thiophene); 2,8-dialkyl, substituted dialkyl, diaryl or substituted diaryl anthradithiophene; 2,2'-bibenzo[1,2-b:4,5-b']dithiophene. Preferred compounds are those from the above list and derivatives thereof which are soluble.

Especially preferred OSC materials are substituted heteroacenes or pentacenes, in particular 6,13-bis(trialkylsilylethynyl)pentacene, or heteroacene derivatives or substituted derivatives thereof, as described in U.S. Pat. No. 6,690,029 or WO 2005/055248 A1.

Optionally, the OSC layer comprises one or more organic binders, to adjust the rheological properties, as described for example in WO 2005/055248 A1.

Unless the context clearly indicates otherwise, as used herein plural forms of the terms herein are to be construed as including the singular form and vice versa.

Throughout the description and claims of this specification, the words "comprise" and "contain" and variations of the words, for example "comprising" and "comprises", mean "including but not limited to", and are not intended to (and do not) exclude other components.

It will be appreciated that variations to the foregoing embodiments of the invention can be made while still falling within the scope of the invention. Each feature disclosed in this specification, unless stated otherwise, may be replaced by alternative features serving the same, equivalent or similar purpose. Thus, unless stated otherwise, each feature disclosed is one example only of a generic series of equivalent or similar features.

All of the features disclosed in this specification may be combined in any combination, except combinations where at least some of such features and/or steps are mutually exclusive. In particular, the preferred features of the invention are applicable to all aspects of the invention and may be used in any combination. Likewise, features described in non-essential combinations may be used separately (not in combination).

It will be appreciated that many of the features described above, particularly of the preferred embodiments, are inventive in their own right and not just as part of an embodiment of the present invention. Independent protection may be sought for these features in addition to or alternative to any invention presently claimed.

The invention will now be described in more detail by reference to the following examples, which are illustrative only and do not limit the scope of the invention.

EXAMPLES

Unless stated otherwise, the OFETs described in the examples are bottom gate OFETs and comprise the following materials and parameters:
Source and drain electrode (S/D): Au
Gate electrode (G): Patterned Al gate
Channel width (W): 1000 μm (length of S and D facing each other)
Channel length (L): 50 μm (distance of S and D from each other
Capacitance (C): 3 nF/cm² = estimated thickness of 1000 nm
Dielectric Material: Avatrel® (Promerus LLC)
OSC Material: 1% polytriarylamine (PTAA) of formula I, n=50, fully H-endcapped

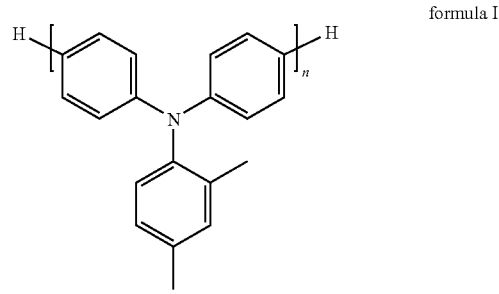

formula I

Unless stated otherwise, the OFETs described in the examples are prepared by the following process steps, wherein step 7 (protection layer application), step 9 (plasma treatment) and step 10 (protection layer development and removal) are optional steps:

1) Commercially available glass substrates (Eagle® 2000, from Corning Glass) are sonicated in 3% Deconex at >50C for 30 min, then rinsed with DI water,
2) a 25 nm Al gate electrode layer is evaporated through a shadow mask,
3) the surface of the substrate is treated by spincoating an adhesion promoter Lisicon M009 (from Merck KGaA),
4) a dielectric layer is applied by spincoating a solution of the insulator material Avatrel® (Promerus LLC) in MAK containing a photoinitiator at 1500 rpm for 30 s onto the device,
5) the dielectric layer is heated on a hotplate to 120° C. for 1 min, and cured by exposure to UV light (254 nm) for 30 sec, followed again by heating on a hotplate to 120° C. for 3 min,
6) reactive washing with Lisicon™ M008 (from Merck KGaA), 7) a protection layer is spincoated and dried on a hotplate (1 min 100° C.),
8) Au electrodes are evaporated through a Mask (25 nm)
9) the device is exposed to $O_2$ plasma, 1 min, 500 W in a Tepla Microwave oven,
10) the protection layer is developed (<1 min soak time, spin off), and washed using appropriate solvents,
11) the device is coated with an SAM treatment (Lisicon™ M001, Merck) and an OSC layer as appropriate.

To measure the performance of the OFET, voltages are applied to the transistor relative to the potential of the source electrode. In the case of a p-type gate material, when a negative potential is applied to the gate, positive charge carriers (holes) are accumulated in the semiconductor on the other side of the gate dielectric. (For an n channel FET, positive voltages are applied). This is called the accumulation mode. The capacitance/area of the gate dielectric $C_i$ determines the amount of the charge thus induced. When a negative potential $V_{DS}$ is applied to the drain, the accumulated carriers yield a source-drain current $I_{DS}$ which depends primarily on the density of accumulated carriers and, importantly, their mobility in the source-drain channel. Geometric factors such as the drain and source electrode configuration, size and distance also affect the current. Typically a range of gate and drain voltages are scanned during the study of the device. The source-drain current is described by Equation 1

$$I_{DS} = \frac{\mu W C_i}{L}\left((V_G - V_0)V_{DS} - \frac{V_{DS}^2}{2}\right) + I_\Omega \quad \text{Equation (1)}$$

wherein $V_0$ is an offset voltage and $I_\Omega$ is an ohmic current independent of the gate voltage and is due to the finite conductivity of the material. The other parameters have been described above.

For the electrical measurements the transistor sample is mounted in a sample holder. Microprobe connections are made to the gate, drain and source electrodes using Karl Suss PH100 miniature probe-heads. These are linked to a Hewlett-Packard 4155B parameter analyser. The drain voltage is set to −5 V and the gate voltage is scanned from +20 to −60V in 0.5 V steps. After this the drain is set to −60V and the gate once again scanned between +20V and −60V. In accumulation, when $|V_G|>|V_{DS}|$ the source-drain current varies linearly with $V_G$. Thus the field effect mobility can be calculated from the gradient (S) of $I_{DS}$ vs. $V_G$ given by Equation 2

$$S = \frac{\mu W C_i V_{DS}}{L} \quad \text{Equation (2)}$$

All field effect mobilities quoted below are calculated from this regime (unless stated otherwise). Where the field effect mobility varies with gate voltage, the value is taken as the highest level reached in the regime where $|V_G|>|V_{DS}|$ in accumulation mode.

The off current of the transistor is defined as the lowest current recorded during the gate sweep from +20V to −60V. This is quoted for both of the drain voltages used. The on/off ratio of the device is defined as the on current at −60V $V_g$ divided by the lowest off current for the $V_d$=−60V scan.

Comparison Example 1

Preparing an OFET without a Protection Layer, with and without Using a Plasma Treatment Step A first series of OFET devices is prepared by steps 1-6, 8 and 11 as described above, without applying and developing a protection layer (step 7, 10) and without plasma treatment (step 9).

A second series of OFET devices is prepared as described above, but is subjected to plasma treatment (step 9, exposure to $O_2$ plasma, 1 min, 1000 W in a Tepla 400 Microwave oven) before applying the electrodes in step 8. The performance of the devices is measured as described above.

Figure 6A:
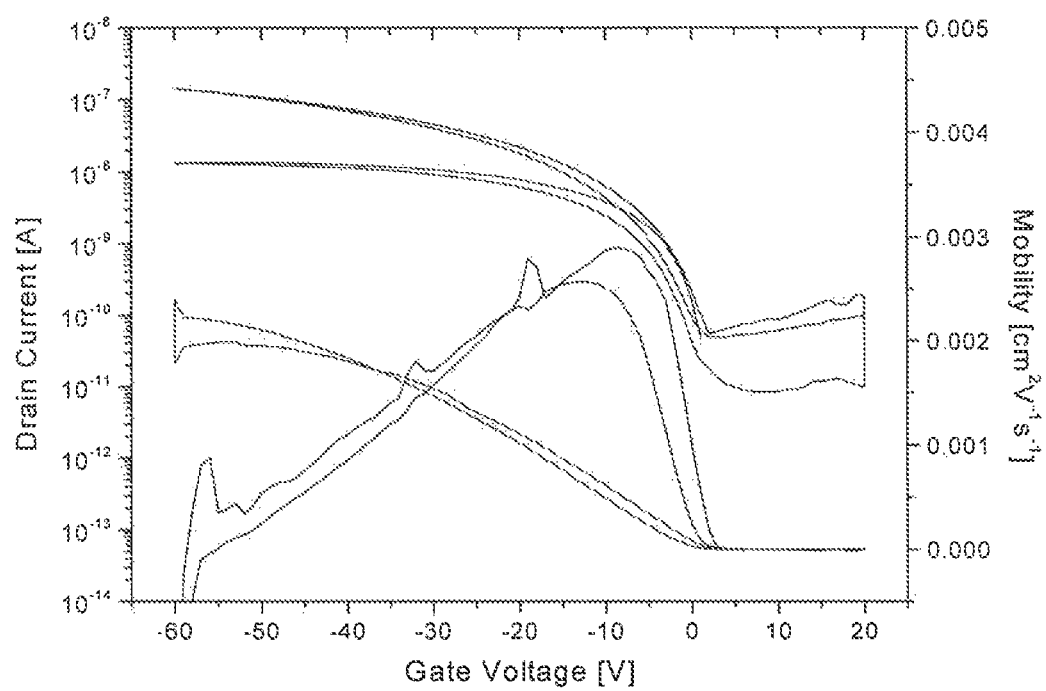
FIGS. 6a and 6b show the transfer characteristics of OFET devices according to comparison example 1.

Table 1 and FIG. 6a show the transfer characteristics, mobility and on/off ratio of the OFETs prepared without a plasma treatment step.

TABLE 1

| Device No. | L/W (µm) | $I_{on}$ (µA) | On/Off Ratio | µ (cm²/Vsec) |
|---|---|---|---|---|
| C1 | 100/1000 | 0.156 | 4510 | 3.10 × 10⁻³ |
| C2 | | 0.148 | 3211 | 2.81 × 10⁻³ |
| C3 | | 0.133 | 5781 | 2.53 × 10⁻³ |
| C4 | | 0.142 | 7686 | 2.80 × 10⁻³ |
| C5 | | 0.146 | 2976 | 2.89 × 10⁻³ |
| Average | | | | 2.83 × 10⁻³ |
| | | | | (std = 0.21 × 10⁻³) |

Figure 6B:
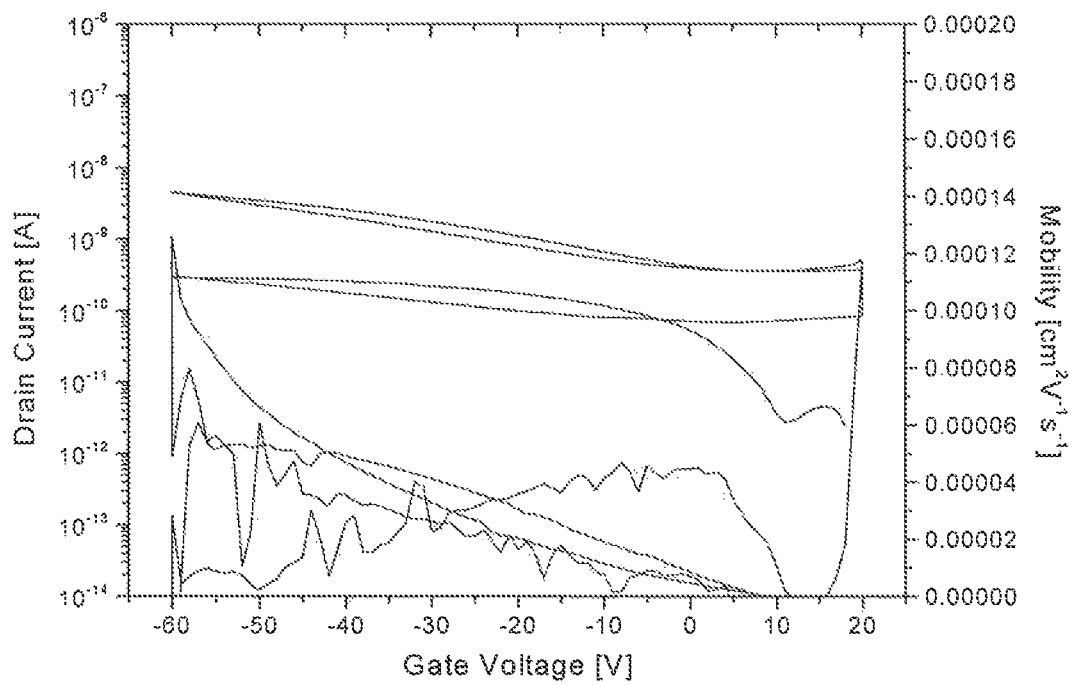

Table 2 and FIG. 6b show the transfer characteristics, mobility and on/off ratio of the OFETs prepared with a plasma treatment step

TABLE 2

| Device No. | L/W (µm) | $I_{on}$ (nA) | On/Off Ratio | µ (cm²/Vsec) |
|---|---|---|---|---|
| C1* | 100/1000 | 3.86 | 16 | 4.57 × 10⁻⁵ |
| C2* | | 4.54 | 13 | 4.47 × 10⁻⁵ |
| C4* | | 5.23 | 13 | 4.35 × 10⁻⁵ |
| C5* | | 4.89 | 10 | 5.07 × 10⁻⁵ |
| C6* | | 5.95 | 6 | 4.78 × 10⁻⁵ |
| Average | | | | 4.65 × 10⁻⁵ |
| | | | | (std = 0.28 × 10⁻⁵) |

It can be seen that the $O_2$-plasma treatment of the dielectric has a devastating effect on the performance of the OFET. The mobility decreases by over two orders of magnitude, as well as the On-current. A possible explanation can be that the surface of the dielectric is polarised by the treatment and thus becomes high k. This in turn reduces the performance of the device significantly.

Example 1

Preparing an OFET with Protection Layer of Varying Thickness, Using a 500 W $O_2$ Plasma Treatment Step A series of OFET devices with a protection layer of varying thickness is prepared and subjected to plasma treatment by steps 1-11 as described above. The dielectric material (step 4) is Avatrel® (from Promerus LLC). The protection layer material (step 7) is an acenaphthene polymer (polyacenaphthylene, Aldrich) of the following formula

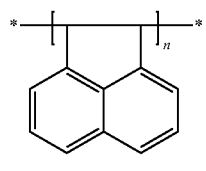

with Mw = 5000-10000

The source and drain electrodes are applied to both series of devices (step 8) before subjecting to an plasma treatment (exposure to $O_2$ plasma, 1 min, 500 W, 500 ml/min in a Tepla 400 Microwave oven). After treatment with $O_2$ plasma (step 9), the protection layer is developed and washed (step 10) using 1:1 Isopropylalcohol:Cyclohexanone mixture (soak for 10 sec, spin coat for 5 sec, wash with Isopropylalcohol).

The OSC material (step 11) is PTAA of formula I shown above.

The performance of the devices is measured as described above.

Figure 7A:
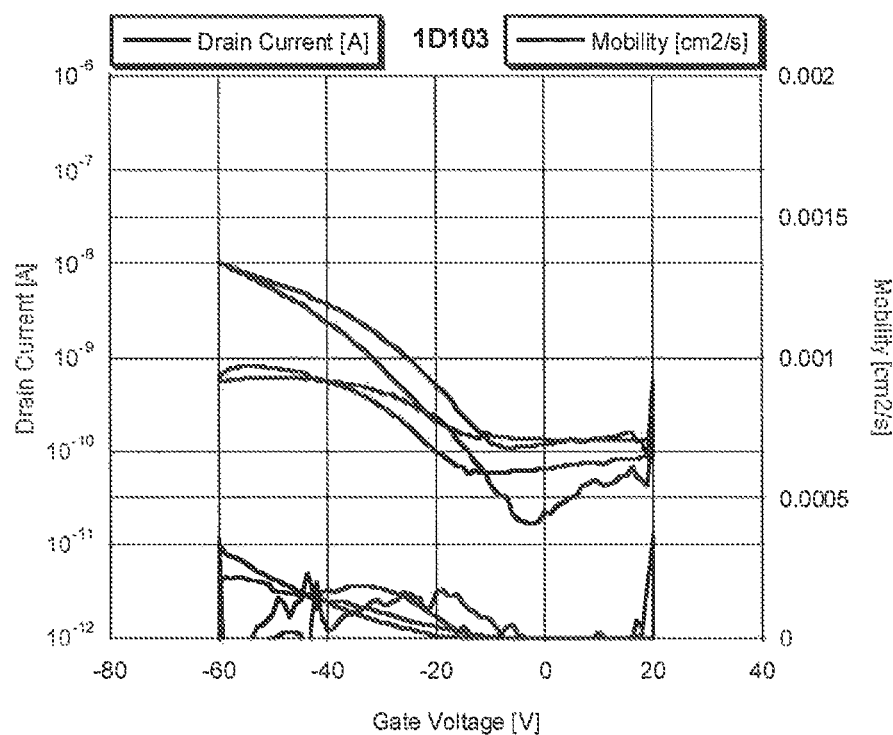
FIGS. 7a-c show the transfer characteristics of OFET devices according to example 1.

Table 3 and FIG. 7a show the transfer characteristics, mobility and on/off ratio of the OFETs as typically measured on the devices prepared without a protection layer (step 7, 10) after 500W O2 plasma treatment (step 9).

TABLE 3

| L/W (μm) | Protection Layer Thickness (nm) | On/Off Ratio | μ (cm$^2$/Vsec) |
|---|---|---|---|
| 50/500 | — | $10^2$ | $1\text{-}2 \times 10^{-4}$ |

Figure 7B:
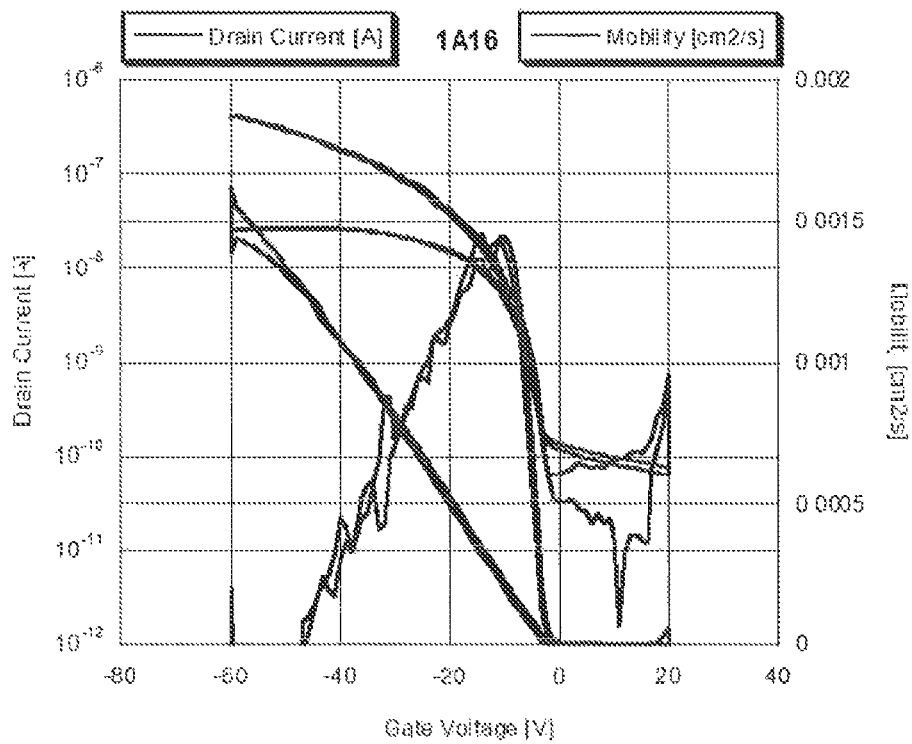

Table 4 and FIG. 7b show the transfer characteristics, mobility and on/off ratio of the OFETs as typically measured on the devices prepared with a 60 nm protection layer (step 7, 10) after 500 W $O_2$ plasma treatment (step 9).

TABLE 4

| L/W (μm) | Protection Layer Thickness (nm) | On/Off Ratio | μ (cm$^2$/Vsec) |
|---|---|---|---|
| 50/1000 | 60 | $10^{3\text{-}4}$ | $1\text{-}2.2 \times 10^{-3}$ |

Figure 7C:
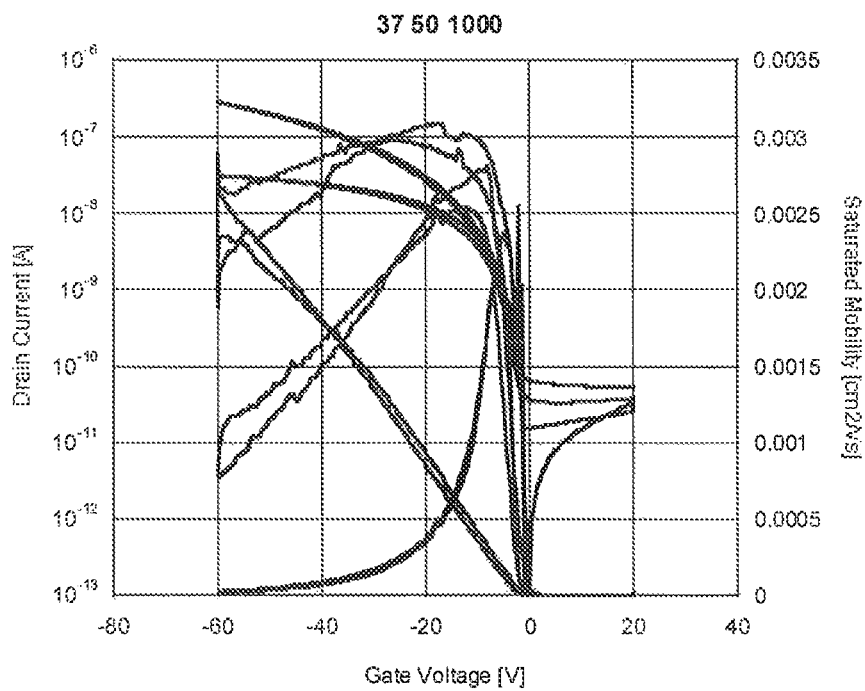

Table 5 and FIG. 7c show the transfer characteristics, mobility and on/off ratio of the OFETs as typically measured on the devices prepared with a 15 nm protection layer (step 7, 10) after 500 W $O_2$ plasma treatment (step 9).

TABLE 5

| L/W (μm) | Protection Layer Thickness (nm) | On/Off Ratio | μ (cm$^2$/Vsec) |
|---|---|---|---|
| 50/1000 | 15 | $>10^3$ | $2\text{-}3 \times 10^{-3}$ |

It can be seen that the $O_2$-plasma treatment on the unprotected dielectric has a devastating effect on the performance of the OFET. The mobility decreases by two orders of magnitude, as well as the On-current. In contrast, the devices with protection layer have a significantly improved performance, with high mobility and On/Off ratio.

From the example above it can also be seen that a protection layer as thin as 15 nm can be used to retain the OFET performance after a 500 W plasma treatment.

Example 2

Figure 8:
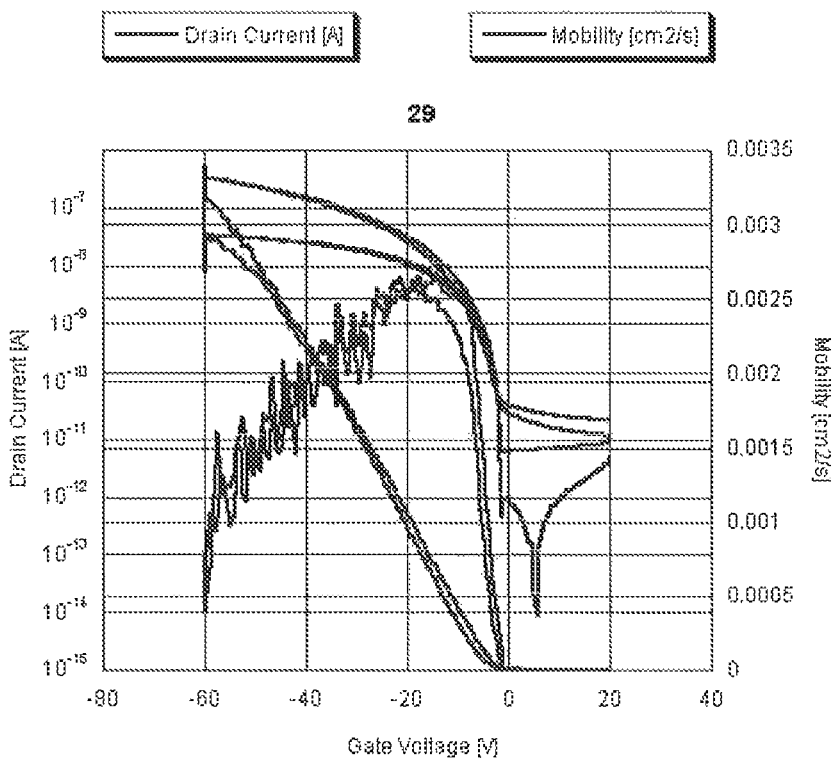
FIG. 8 shows the transfer characteristics of OFET devices according to example 2.

Preparing an OFET with Protection Layer of 60 nm Thickness, Using a 1 kW $O_2$ Plasma Treatment Step Table 6 and FIG. 8 show the transfer characteristics, mobility and on/off ratio of the OFETs as typically measured on the devices prepared with a 60 nm protection layer step (step 7, 10) after plasma treatment (step 9). The intensity of the O2-plasma is doubled (1 kW instead of 500 W) compared to example 1.

TABLE 6

| L/W (μm) | Protection Layer Thickness (nm) | On/Off Ratio | μ (cm$^2$/Vsec) |
|---|---|---|---|
| 50/500 | 60 | $>10^3$ | $2\text{-}3 \times 10^{-3}$ |

Using a higher microwave power (1 kW) for creating the plasma requires a thicker protective layer (minimum 60 nm) in order to fully recover the initial device performance (reference in comparison example). Thinner protective layers do not recover the initial device performance and result in lower mobility, On/Off and positive turn-on.

Example 3

Preparing an OFET with and without a Protection Layer, Using a $CF_4$ Plasma Treatment Step A first series of OFET devices is prepared by steps 1-6, 8 and 11-12 as described above, without applying a protection layer (step 7, 10). A second series of OFET devices is prepared as described above, including the aforementioned protection layer of thickness 60 nm (step 7, 10). The dielectric material (step 4) is Avatrel® (from Promerus LLC). The protection layer material (step 7) is Hardsil AR (from Gelest).

The source and drain electrodes are applied to both series of devices (step 8) before subjecting to a plasma treatment (step 9, exposure to 1:1 $CF_4$:Argon plasma, 1 min, 1000 W, 250 ml/min $CF_4$, 250 ml/min Argon in a Tepla 400 Microwave oven). These plasma conditions are frequently used to modify the surface of bank structures (change of the contact H2O angle to around)110°. After treatment with $CF_4$:Ar plasma (step 9), the protection layer is developed and washed (step 10) using 1:1 Isopropylalcohol:Cyclohexanone mixture (soak for 10 sec, spin coat for 5 sec, wash with Isopropylalcohol).

The OSC material (step 11) is PTAA of formula I as defined above.

The performance of the devices is measured as described above.

Figure 9A:
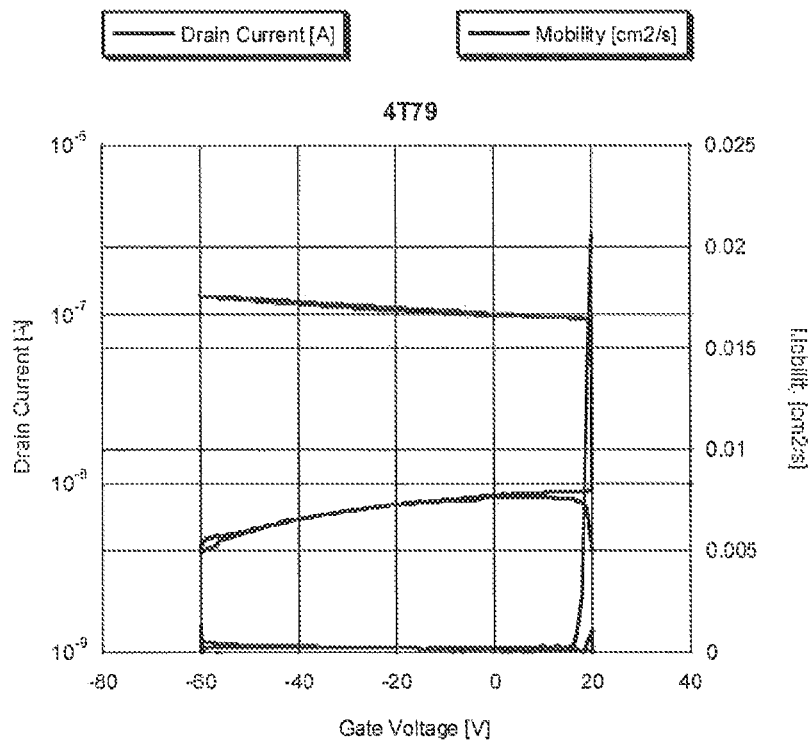
FIGS. 9a and 9b show the transfer characteristics of OFET devices according to example 3.

Table 7 and FIG. 9a show the transfer characteristics, mobility and on/off ratio of the OFETs as typically measured on the devices prepared without a protection layer step (step 7, 10) after plasma treatment (step 9).

TABLE 7

| L/W (μm) | Protection Layer Thickness (nm) | On/Off Ratio | μ (cm²/Vsec) |
|---|---|---|---|
| 50/500 | — | 0 | 0 |

Figure 9B:
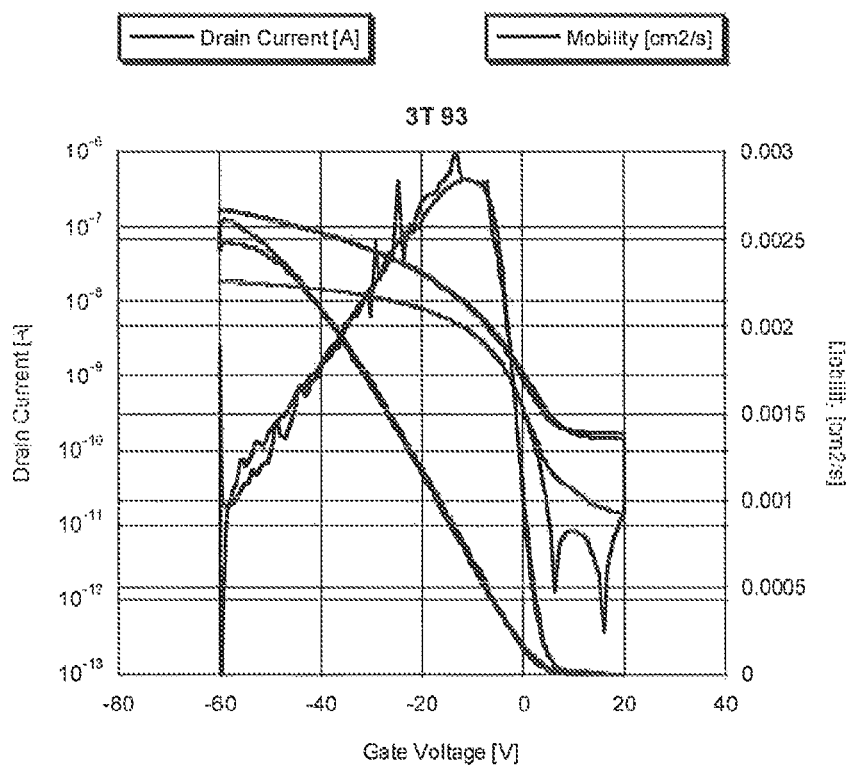

Table 8 and FIG. 9b show the transfer characteristics, mobility and on/off ratio of the OFETs as typically measured on the devices prepared with a protection layer step (step 7, 10) after plasma treatment (step 9).

TABLE 8

| L/W (μm) | Protection Layer Thickness (nm) | On/Off Ratio | μ (cm²/Vsec) |
|---|---|---|---|
| 50/500 | 60 | $10^3$ | $1$-$3 \times 10^{-3}$ |

It can be seen that the $CF_4$:Ar plasma conditions are much harsher than the $O_2$ plasma conditions (example 1, 2), so that in the absence of a protection layer no reasonable field-effect can be observed. The use of a 60 nm protection layer is suitable to prevent deterioration of the OFET performance.

The invention claimed is:

1. A process for preparing a transistor device, comprising a dielectric layer (3) and an organic semiconductor (OSC) layer (7), the process comprising
applying a sacrificial layer (4) on top of a dielectric layer (3) or on top of an organic semiconductor (OSC) layer (7),
applying a further layer on at least some parts of the sacrificial layer (4), wherein said further layer is a conductor or a gate, source or drain electrode,
subjecting the device to plasma treatment after said sacrificial layer (4) has been applied or wherein said further layer is patterned, and
removing those parts of the sacrificial layer (4) that have been exposed to the plasma or are not covered by the further layer after patterning.

2. A process according to claim 1, wherein the transistor device is a bottom gate (BG), bottom contact (BC) transistor device comprising the following components in the sequence described below:
optionally a substrate (1),
a gate electrode (2),
an insulator layer comprising a dielectric (3),
source and drain electrodes (5),
an OSC layer (7), and
a sacrificial layer (4) between the insulator layer and the source and drain electrodes.

3. A process according to claim 2, comprising applying a gate electrode (2) on a substrate (1), applying a dielectric layer (3) on top of the gate electrode (2) and the substrate (1), applying a sacrificial layer (4) on top of the dielectric layer (3), applying source and drain electrodes (5) on top of the sacrificial layer (4), removing those parts of the sacrificial layer that are not covered by the source and drain electrodes (5), and applying an OSC layer (7) on top of the electrodes (5) and the dielectric layer (3).

4. A process according to claim 1, wherein the transistor device is a top gate (TG), BC transistor device comprising the following components in the sequence described below:
a substrate (1),
source and drain electrodes (5),
an OSC layer (7),
an insulator layer comprising a dielectric (3),
a gate electrode (2), and
a sacrificial layer (4) between the insulator layer and the gate electrode.

5. A process according to claim 4, comprising applying source and drain electrodes (5) on a substrate (1), applying an OSC layer (7) on top of the electrodes (5) and the substrate (1), applying a dielectric layer (3) on top of the OSC layer (7), applying a sacrificial layer (4) on top of the dielectric layer (3), applying a gate electrode (2) on top of the sacrificial layer (4), and removing those parts of the sacrificial layer that are not covered by the gate electrode (2).

6. A process according to claim 1, wherein the transistor device is a TG, TC transistor device comprising the following components in the sequence described below:
a substrate (1),
an OSC layer (7),
source and drain electrodes (5),
an insulator layer comprising a dielectric (3),
a gate electrode (2), and
a sacrificial layer (4a) between the OSC layer and the source and drain electrodes and a sacrificial layer (4b) between the insulator layer and the gate electrode.

7. A process according to claim 6, comprising applying an OSC layer (7) on a substrate (1), applying a sacrificial layer (4a) on top of the OSC layer (7), applying source and drain electrodes (5) on top of the OSC layer (7) or the sacrificial layer (4a), optionally removing those parts of the sacrificial layer (4a) that are not covered by the source and drain electrodes (5), applying a dielectric layer (3) on top of the source and drain electrodes (5), applying a sacrificial layer (4b) on top of the dielectric layer (3), applying a gate electrode (2) on top of the dielectric layer (3) or the sacrificial layer (4b), and removing those parts of the sacrificial layer (4b) that are not covered by the gate electrode (2).

8. A process according to claim 1, wherein the device is exposed to a plasma of high energy particles or beams after applying the sacrificial layer (4).

9. A process according to claim 8, wherein said plasma is a plasma of $O_2$, Ar or $CF_4$ or a mixture thereof.

10. A process according to claim 1, wherein the thickness of the sacrificial layer is from 1 to 500 nm.

11. A process according to claim 1, wherein the sacrificial layer comprises an organic or inorganic material.

12. A process according to claim 11, wherein the sacrificial layer comprises a material selected from the group consisting of organic polymers, inorganic oxides, nanoparticles, and hybrids thereof, all of which are solution processable or vacuum deposited.

13. A process according to claim 11, wherein the sacrificial layer comprises a polymer selected from the group consisting of partially fluorinated organic polymers, perfluorinated organic polymers, polyimides, polycycloolefins, polycycloolefins with alkoxysilane groups, polycycloolefins with vinyl alkoxy silane groups, curable polysilsesquioxanes, thermosetting polysiloxane resins, polyacenaphthylenes, poly-N-vinylcarbazoles, poly(2-vinylnaphthalenes), poly(4-vinylbiphenyls), poly(1-vinylnaphthalenes), and precursors thereof.

14. A transistor device obtained by a process according to claim 1.

15. A transistor device according to claim 14, which is an OFET, integrated circuit (IC), thin film transistor (TFT), or Radio Frequency Identification (RFID) tag.

16. A process according to claim 1, wherein the dielectric layer is a gate insulator.

17. A process according to claim 1, wherein the dielectric layer is an insulating interlayer.

18. A process according to claim 1, wherein said further layer is a conductor.

19. A process according to claim 1, wherein said further layer is a gate, source or drain electrode.

20. A process according to claim 1, wherein said sacrificial layer is subjected to plasma treatment.

21. A process according to claim 1, wherein a sacrificial layer is placed in the transistor between the dielectric layer, which is a gate insulator (84*a*) or the semiconductor layer (44) and the gate electrode (42) or source and drain electrodes (41, 43).

22. A process for preparing a transistor device, comprising a dielectric layer (3) and an organic semiconductor (OSC) layer (7), the process comprising
  a) providing one or more gate electrodes (2) on a substrate (1),
  b) providing a layer of a dielectric (3) on the substrate (1) and the gate electrodes (2),
  c) providing a sacrificial layer (4) on top of the dielectric layer (3),
  d) providing one or more second electrodes (5) on top of the sacrificial layer (4),
  e) providing a photoresist layer (6) on top of the second electrodes (5),
  f) treating the photoresist (6) to leave a pattern of areas with photoresist and a pattern of areas without photoresist (6) on top of the second electrodes (5), wherein possible residues are formed,
  g) removing those parts of the second electrodes (5) that are not covered by the photoresist (6), to form source and drain electrodes (5) that are covered by the photoresist,
  h1) removing the photoresist (6),
  i1) removing those parts of the sacrificial layer (4) that are not covered by the source and drain electrodes (5),
  k1) optionally treating the remaining parts of the sacrificial layer (4), optionally by washing, to remove possible residues caused by step f), which residues optionally include ions, or doping sites, and
  m1) applying an OSC layer (7) onto the uncovered parts of the dielectric layer (3) and the source and drain electrodes (5),
  or, alternatively to steps h1)-m1),
  h2) removing those parts of the sacrificial layer (4) that are not covered by the source and drain electrodes (5),
  i2) optionally curing the remaining parts of the sacrificial layer (4),
  k2) removing the photoresist (6),
  m2) optionally treating the remaining parts of the sacrificial layer (4), optionally by washing, to remove possible residues caused by step f), which residues optionally include ions, or doping sites, and
  n2) applying an OSC layer (7) onto the uncovered parts of the dielectric layer (3) and the source and drain electrodes (5).

23. A process for preparing a transistor device, comprising a dielectric layer (3) and an organic semiconductor (OSC) layer (7), the process comprising
  a) providing one or more gate electrodes (2) on a substrate (1)
  b) forming a layer of a dielectric (3) on the substrate (1) and the gate electrodes (2),
  c) providing a sacrificial layer (4) on top of the dielectric layer (3),
  d) providing one or more source and drain electrodes (5) on top of the sacrificial layer (4),
  e) providing a bank structure layer (6) on top of the sacrificial layer (4) and the source and drain electrodes (5), so that it does at least partially cover the sacrificial layer (4) and the source and drain electrodes (5),
  f) subjecting the bank structure layer (6), and those parts of the sacrificial layer (4) that are not covered by the source and drain electrodes (5) or the bank structure layer (6), to plasma treatment, wherein possible residues are formed,
  g) removing those parts of the sacrificial layer (4) that are not covered by the source and drain electrodes (5) or the bank structure layer (6),
  h) optionally treating the remaining parts of the sacrificial layer (4), optionally by washing, to remove possible residues caused by step f), which residues optionally include ions, or doping sites, and
  i) applying an OSC layer (7) onto the uncovered parts of the dielectric layer (3) and the source and drain electrodes (5).

* * * * *

UNITED STATES PATENT AND TRADEMARK OFFICE
CERTIFICATE OF CORRECTION

PATENT NO.        : 8,637,343 B2                                                    Page 1 of 1
APPLICATION NO.   : 12/597246
DATED             : January 28, 2014
INVENTOR(S)       : Mueller et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 44 days.

Signed and Sealed this
Twenty-second Day of September, 2015

Michelle K. Lee
*Director of the United States Patent and Trademark Office*